United States Patent [19]

Moffat

[11] Patent Number: 5,025,570
[45] Date of Patent: Jun. 25, 1991

[54] MODULAR CONVECTIVE OVEN WITH ANTI-CONTAMINATION FEATURES

[76] Inventor: William A. Moffat, 4436 Adragna Ct., San Jose, Calif. 95136

[21] Appl. No.: 600,530

[22] Filed: Oct. 19, 1990

[51] Int. Cl.⁵ ............................................. F26B 21/06
[52] U.S. Cl. ...................................... 34/72; 34/211; 34/212; 34/215; 34/213; 432/152
[58] Field of Search ................ 34/209, 211, 213, 214, 34/215, 218, 224, 226, 231, 72; 432/143, 144, 152; 126/19 R, 21 A, 21 R

[56] References Cited

U.S. PATENT DOCUMENTS

| | | | |
|---|---|---|---|
| 201,131 | 3/1878 | Tiffany | 34/211 |
| 1,010,809 | 12/1911 | Schmidt et al. | 34/213 |
| 1,014,190 | 1/1912 | Wenborne | 34/213 |
| 2,312,986 | 3/1943 | Buck | 34/211 |
| 2,370,422 | 2/1945 | Reed | 34/213 |
| 3,399,680 | 9/1968 | Egri | 34/211 |
| 4,531,304 | 7/1985 | Wauhop, Jr. et al. | 34/211 |
| 4,597,736 | 7/1986 | Moffat | 432/26 |
| 4,823,480 | 4/1989 | Komatsuzaki | 34/218 |

Primary Examiner—Henry A. Bennet
Assistant Examiner—Denise L. F. Gromada
Attorney, Agent, or Firm—Schneck & McHugh

[57] ABSTRACT

An oven employing a group of identical modular oven units, each unit divided into a main cavity with a first upper auxiliary chamber and a second lower auxiliary chamber. A barrier plate separating the upper chamber from the main cavity is gas pervious and serves as a filter to separate micron size particles and larger from entering the main chamber as the particles are carried by heated inert gas or air passing into the main cavity. The barrier plate separating the lower chamber from the main cavity is also gas pervious and serves as a sink to adsorb particles of sizes up to 100 microns. The group of modular ovens is partially surrounded by a heat transfer wall which allows heat to be rejected from the modular ovens and removed by a fluid coolant in contact with the wall.

2 Claims, 2 Drawing Sheets

MODULAR CONVECTIVE OVEN WITH ANTI-CONTAMINATION FEATURES

TECHNICAL FIELD

The invention relates to convection ovens and in particular to such ovens for heat treating semiconductor wafers with means for removing contaminant particles.

BACKGROUND ART

In the manufacture of semiconductors, the contamination of wafers by particles generated in the manufacturing process is known to severely decrease the yield of viable integrated circuit chips. Accordingly, at all stages in the semiconductor manufacturing process, care is taken to avoid contamination of wafers, such as by use of clean rooms and by use of equipment which does not produce particles while treating wafers.

Previously, convection ovens have been used which employed an inert gas to transfer heat to the wafers. An example of such an oven is found in U.S. Pat. No. 4,597,736 to W. Moffat. In this patent, a preheated inert gas is injected into an oven wherein wafers are heated due to convective heat transfer from the inert gas.

Even though the inert gas is very pure, it is possible for the gas to pick up particles somewhere before release in the oven. Also, particles which are already on the wafer, may be dislodged by gas flow and redistributed from one location to another.

An object of the invention is to improve convective ovens for heat treatment of semiconductor wafers and in particular to provide an oven having anti-contamination features protecting oven contents against foreign particulate matter.

SUMMARY OF THE INVENTION

The above object has been met with oven modules having a main cavity separated on opposite sides by two auxiliary chambers at gas pressures different from the main cavity. A first auxiliary chamber, preferably above the main cavity, is used as a plenum for introduction of heated gas through a gas pervious wall equipped to filter particles. Small apertures in the wall allow passage of gas, but block particles. The second auxiliary chamber, opposite the first, also has a gas pervious wall facing the main oven cavity. The latter wall has larger openings than the wall associated with the first auxiliary chamber, but is configured to act as a sink for any particles which impinge thereon. Hot gas at a high pressure is introduced into the first auxiliary chamber while cooler gas at relatively low pressure is removed from the second auxiliary chamber. Between the two auxiliary chambers, gas flows in a non-turbulent manner from the first auxiliary chamber toward the second. A plurality of similar oven modules may be provided within a single housing. The housing has thermally conductive walls which allow heat transfer from the modular ovens, through the wall, for subsequent removal by a coolant gas flowing immediately outside the wall. Conductive or radiative blocks may be used to enhance heat transfer from the wall periphery to the coolant gas.

BEST MODE FOR CARRYING OUT THE INVENTION

Figure 1:
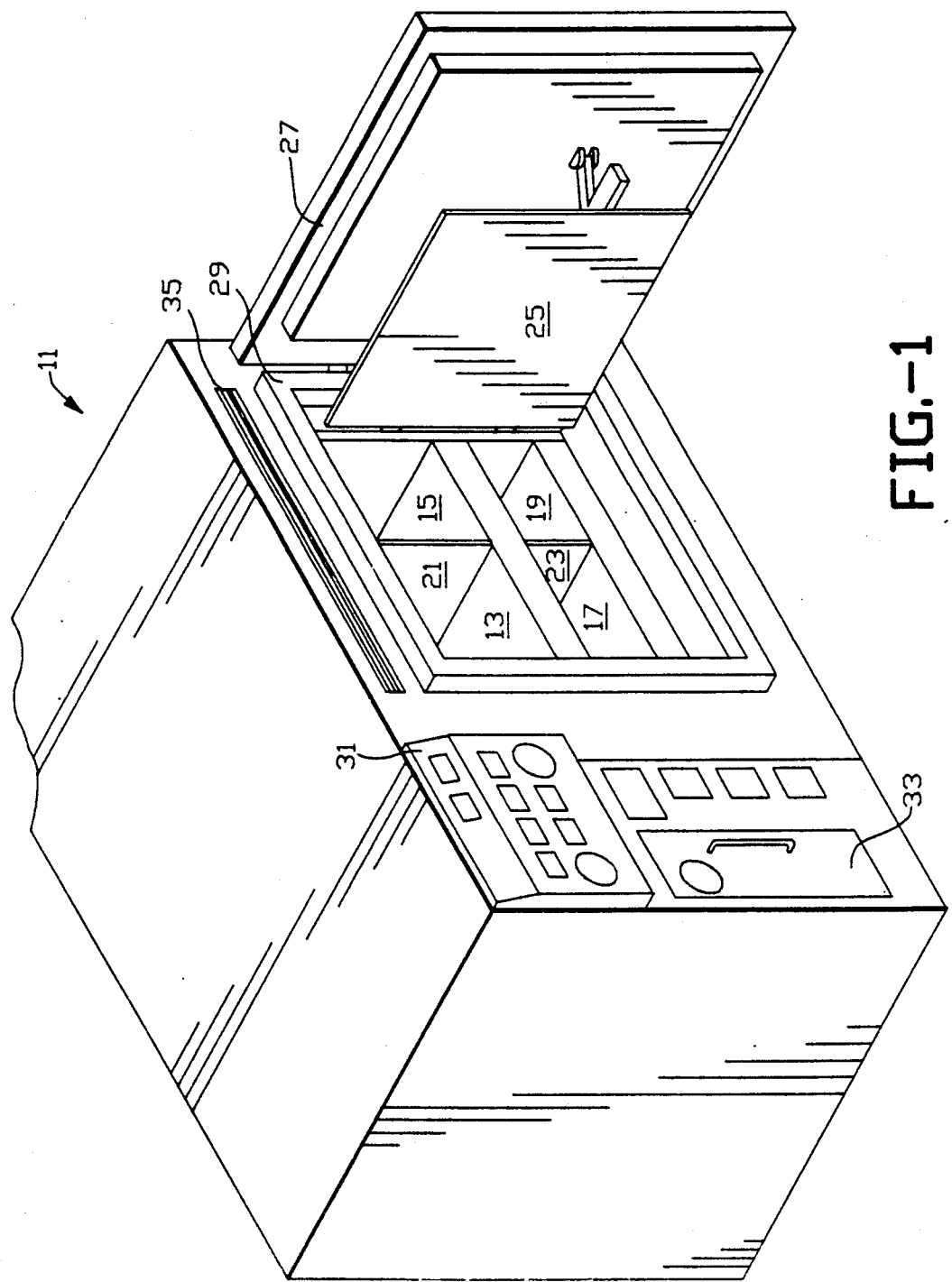
FIG. 1 is a perspective view of an oven of the present invention.

With reference to FIG. 1, an oven 11 is shown having four modular ovens 13, 15, 17 and 19. The modular ovens are laterally separated from each other by insulative walls 21 and 23. The modular ovens are closed with an insulative door 25 which is slightly spaced from an outer door 27. Outer door 27 is sealed by a gasket 29 which prevents air leakage into the oven or gas flow out of the oven.

Electronic controls 31 provide temperature settings in individual modular ovens, as well as vacuum settings and switches. A door 33 is provided for ingress into a chemistry unit where chemicals to be used within the oven may be stored. Use of chemicals is not contemplated in the context of the present invention, but may be used in optional modes of operation. Above the outer door 27 is an air intake port 35 which allows cooling air to enter a peripheral channel for removing heat from the apparatus.

Figure 2:
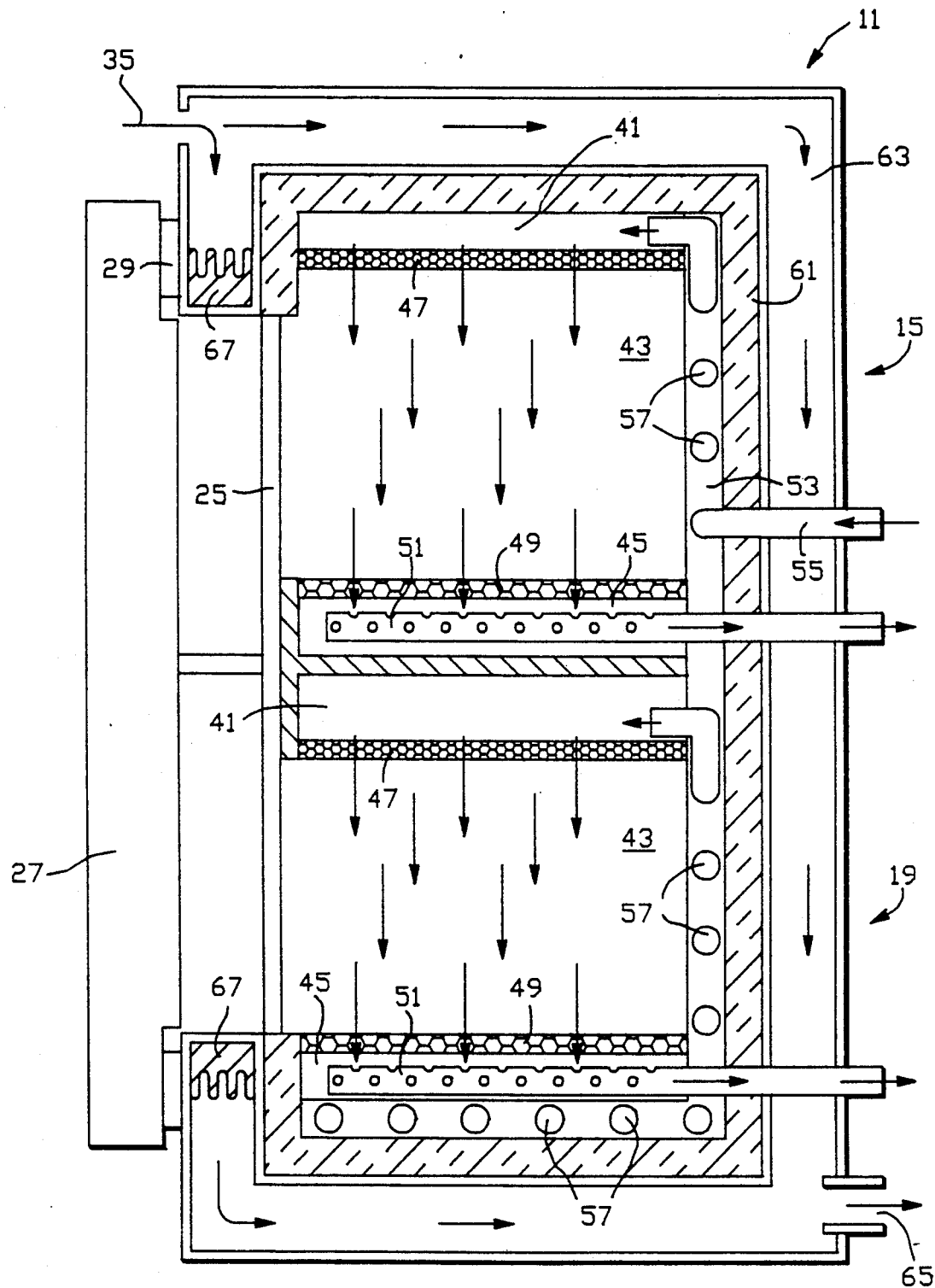
FIG. 2 is a side sectional view of the apparatus of FIG. 1.

With reference to FIG. 2, the oven module 15 is seen to be stacked over oven module 19. Each oven module has an upper chamber or plenum 41, a central cavity 43 and a lower chamber or plenum 45. While upper and lower auxiliary plenums are preferred, laterally opposed auxiliary plenums could also be used. The upper plenum 41 is separated from the central cavity 43 by a stainless steel multi-orifice particle filter 47. The particle filter resembles honeycomb material with channels having a dimension, such as a diameter, of 0.5 microns. This small diameter allows the pressure in upper plenum 41 to be substantially higher than the pressure in the central cavity. For example, pure hot nitrogen or hot air or other pure gas pumped into the upper plenum 41 may be at a typical pressure of 120 millibars and a typical temperature of 300° C., with a high temperature of 450° C. The thickness of the multi-orifice particle filter 47 is approximately 0.25 centimeters, which is not a critical dimension.

Gas flowing through the particle filter is channeled along linear pathways formed by the cells of the filter. If the filter is honeycomb material, the honeycomb cell pathways are aligned so that air flows vertically downward as indicated by the arrows emerging through the particle filter 47. Gas emerging from the filter is intended to be laminar to the maximum extent possible. When the flow encounters objects within the oven, the flow becomes non-laminar, eddies are introduced and particles may be jarred loose from exposed surfaces in each oven module. Such loose particles may be carried by the flow and so it is important to provide a sink for such particles. An effort has been made to provide a particle trap 49 which is another plate with honeycomb channels. However, the multi-orifice plate has larger orifices than particle filter 47. In the case of particle trap 49, the orifice dimension, such as the diameter, is 100 microns. This allows particles to be drawn into a channel, but escape is difficult. Particles either adhere to the walls of the channels or are drawn to the opposite side where they are removed by a low pressure line 51. Low pressure line 51 is a perforated pipe connected to a throttled vacuum pump which is outside of oven 11. The pressure in the lower plenum 45 is less than the pressure in the central cavity 43 which in turn is less than the pressure in the upper plenum 41.

Heated air or nitrogen is pumped into each oven module through a peripheral pipe 53 which receives heated gas through one or more inlet pipes 55 feeding into apertures 57 for delivering the heated gas into the upper plenum 41 of each modular oven. The delivery rate in each modular oven may be up to 7 cubic feet per minute. While the gas which is delivered has been previously filtered and is considered to be very pure, the multi-orifice particle filter 47 provide additional filtration. The particle filter 47 and the particle trap 49 are plates which completely extend across each modular oven dividing the modular oven into the upper plenum, central cavity and lower plenum. Approximately 1.5 kilowatts of thermal energy is transferred into each oven module, a total of 6 kilowatts for four modules. This energy is intended to heat objects placed in the oven, such as a stack of semiconductor wafers. Adjustment of gas temperature and time of heating within the modular ovens is determined by a user to achieve the desired object temperatures. Clearly, much of the thermal energy transmitted into the oven is lost to the walls. In this regard, a thermal transfer wall 61 serves as the back of each oven module and either the top wall or bottom wall thereof. The thermal transfer wall has moderately good thermal conductivity, such as the conductivity of stainless steel. Stainless is a good material because it will allow removal of moderate amounts of heat which is rejected from each oven module. Surrounding the thermal transfer wall 61 is a gas flow chamber which is approximately coextensive with the thermal transfer wall. The gas flow chamber 63 allows cool air to enter through a longitudinal air intake port 35 and remove heat by contact with the thermal transfer wall 61. An exhaust fan pulls air from an exhaust port 65 at the bottom rear of the apparatus. Within the gas flow chamber 63, heat transfer blocks 67 may be used to receive heat from thermal transfer wall 61 by means of conduction. Heat is then either radiated or convectively transferred by the blocks to the air which has entered air intake port 35. Fins on the blocks promote heat transfer by increasing surface area.

In operation, high pressure gas entering the upper plenum is filtered by being forced through honeycomb shaped channels of diameter of the order of 0.5 microns. The air or gas emerging from the upper plenum is ultra pure and has been previously heated to a temperature where it will substantially heat objects in the central cavity of each oven module. Having heated objects in the chamber, the gas flow stream is pulled through a lower plenum 45, similar to the upper plenum 41, except that the pore sizes are considerably larger. In the lower plenum, heated gas is pulled out of the system by a low pressure line 51. Heat rejected by the unit is transferred by a thermally conductive wall to a fluid coolant, which is preferably air, but could be another gas or even a liquid.

I claim:

1. A convection oven with particle removal apparatus comprising,
    a walled enclosure having a first plenum, a central cavity and a second plenum, the first plenum separated from the central cavity by a multi-orifice particle filter, the second plenum separated from the central cavity by a multi-orifice means for removing particles impinging on said means, said multi-orifice means for removing particles being a structure having a plurality of channels with open ends facing said central cavity, said channels having a diameter in the range of 50 to 150 microns,
    a first gas conduit communicating heated gas from outside said walled enclosure into said first plenum at a first pressure,
    a second gas conduit communicating heated gas from said second plenum to a region outside said walled enclosure at a second pressure, the second pressure lower than the first pressure, and
    heat sink means in thermal transfer relation with said walled enclosure for removing heat therefrom.

2. The apparatus of claim 1 wherein said plurality of channels are formed in a plate.

* * * * *